(12) United States Patent
Edwards et al.

(10) Patent No.: US 9,552,356 B1
(45) Date of Patent: Jan. 24, 2017

(54) MERGING CLIENT-SIDE AND SERVER-SIDE LOGS

(75) Inventors: David J. Edwards, Seattle, WA (US); Peter V. Commons, Issaquah, WA (US); Amanda M. Aten, Sumner, WA (US)

(73) Assignee: Amazon Technologies, Inc., Seattle, WA (US)

( * ) Notice: Subject to any disclaimer, the term of this patent is extended or adjusted under 35 U.S.C. 154(b) by 1363 days.

(21) Appl. No.: 11/963,642

(22) Filed: Dec. 21, 2007

(51) Int. Cl.
G06F 7/00 (2006.01)
G06F 17/30 (2006.01)

(52) U.S. Cl.
CPC .................................. G06F 17/30 (2013.01)

(58) Field of Classification Search
None
See application file for complete search history.

(56) References Cited

U.S. PATENT DOCUMENTS

| | | | | |
|---|---|---|---|---|
| 2002/0116418 A1* | 8/2002 | Lachhwani et al. | .......... | 707/517 |
| 2003/0126111 A1* | 7/2003 | Nareddy et al. | .................. | 707/1 |
| 2003/0172113 A1* | 9/2003 | Cameron et al. | ............. | 709/204 |
| 2007/0244750 A1* | 10/2007 | Grannan et al. | ................ | 705/14 |
| 2008/0126476 A1* | 5/2008 | Nicholas et al. | ............. | 709/203 |
| 2008/0209007 A1* | 8/2008 | Gurecki et al. | ............... | 709/218 |
| 2008/0275951 A1* | 11/2008 | Hind et al. | .................... | 709/204 |
| 2009/0132601 A1* | 5/2009 | Cundiff et al. | ............... | 707/200 |

* cited by examiner

Primary Examiner — Hosain Alam
Assistant Examiner — Thu Nga Nguyen
(74) Attorney, Agent, or Firm — Lee & Hayes, PLLC

(57) ABSTRACT

Techniques described enable creation of a single log containing information from both server-side and client-side logs. A logging service receives page requests and other data from a user operating a computing device. These page requests are then stored in a server-side log. The logging service also receives interactions made by the user on a displayed page. These interactions are then stored in a client-side log separate from the server-side log. The logging service then converts a format of the data in the client-side log and merges the client-side and server-side logs to form a single log. A service provider may then analyze this single log to track how this and other users navigated the pages associated with the page requests.

18 Claims, 5 Drawing Sheets

MERGING CLIENT-SIDE AND SERVER-SIDE LOGS

BACKGROUND

Service providers operating websites and the like often employ logs to determine and track how users navigate and consume pages associated with a provider's website. For instance, a service provider may maintain a server log that tracks pages viewed by consuming users. Unfortunately, these users often interact with the pages in ways that are transparent to the server log. However, this transparent interaction information may be helpful to the service provider as the provider strives to increase an efficacy of the website.

For at least the above-identified reasons, there is a need for improved approaches to determine how users navigate and consume pages such as webpages.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
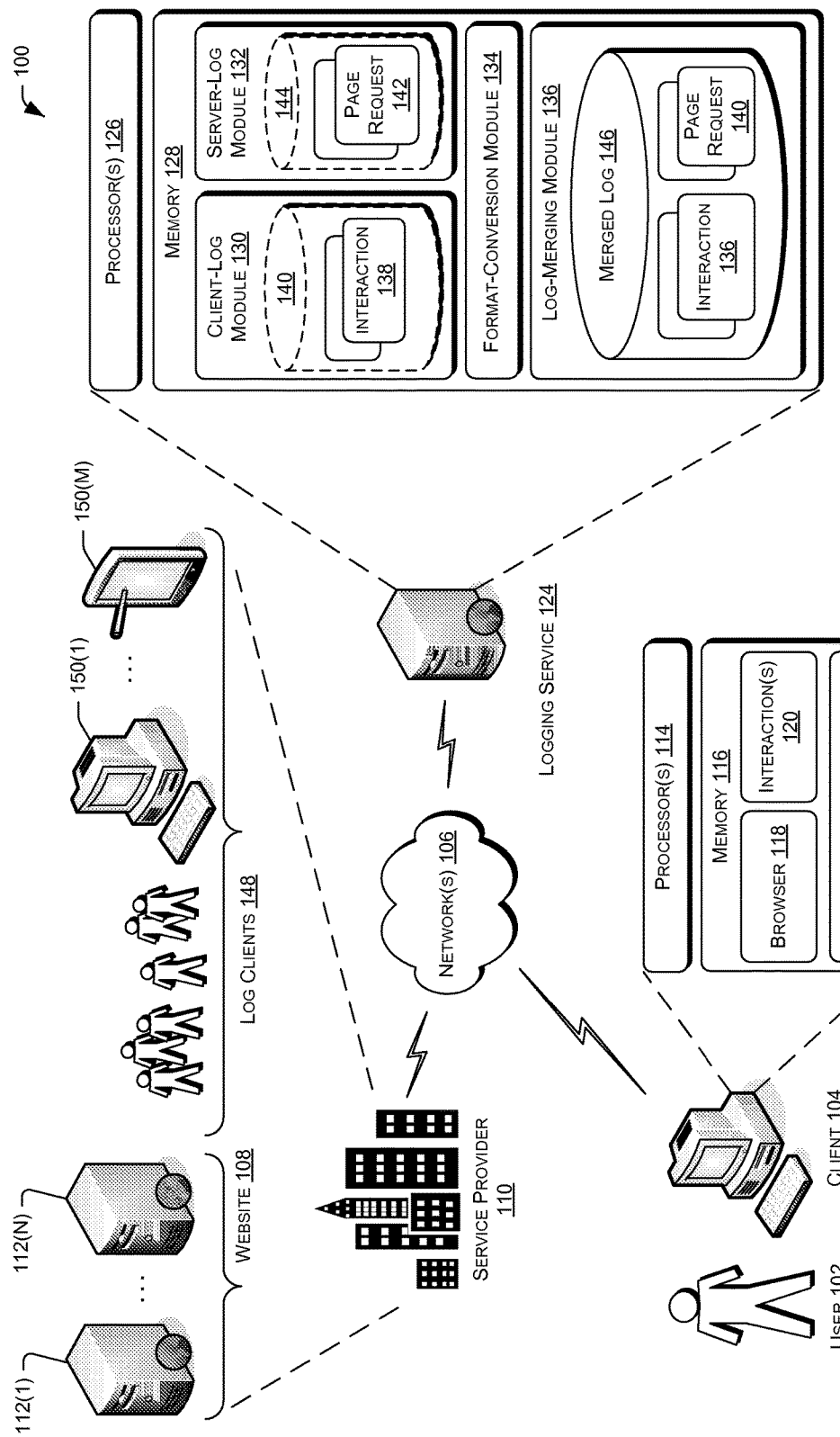
FIG. 1 is a schematic diagram of an illustrative architecture for merging client-side and server-side logs in a networked environment. The networked environment includes a user operating a client computer, a website of a service provider, and a logging service for merging client-side and server-side logs.

Embodiments of the present disclosure are directed to, among other things, merging client-side and server-side logs into a single log. For instance, an entity that hosts a site such as a website may collect information (e.g., page requests, IP addresses, referring uniform resource locator (URL), etc.) made by users of the site in a server-side log. Additionally, the entity may collect information about client interactions that occur on client computing devices operated by the users navigating the site. These interactions may include any interaction between the user and a displayed page, such as scrolling down the page, selecting a tab on the page, playing a video displayed on the page, selecting a program object (e.g., a javascript object, or any client-side object running on a client-side browser) on the page, and/or altering a location of a cursor on the page. These interactions may also include any sort of interaction, user-initiated or otherwise, that may be transparent to the server-side logs. For example, these interactions may include determining whether a page has been rendered correctly on a client-side (e.g., by looking at a document object model (DOM) data structure). Additionally or alternatively, the interactions may include determining page-render performance information, such as information indicating how long it took for a page to render on a client. The entity may then store this history of client interactions in a client-side log.

Next, the entity may convert a format of one or both of the data in the server-side and client-side logs such that the respective formats match one another. The entity then merges the data from these logs into a single log that represents a thorough and complete click stream of users' navigations through the pages offered on the site. The entity may then mine this single log to learn about user behavior and, hence, improve the efficacy of the site. Additionally or alternatively, the entity may also analyze the data within the single log to detect potentially malicious or fraudulent behavior.

In the past, entities that actually serve content (e.g., website owners) have employed server-side logs to determine user behavior. That is, these entities track pages that users have requested from the entity's site. Tracking these page requests in a server-side log has typically proven adequate to determine user behavior. However, more and more pages such as webpages are employing script that, when selected, is undetectable at an entity's server. For instance, selection of a Java object on a webpage may be undetectable to a corresponding server-side log, as all of the script necessary to run the object is provided to a browser when the page is initially rendered.

Entities that direct users to these sites (e.g., search engines), meanwhile, have employed client-side logs to determine user behavior. For instance, a search engine may employ a client-side log to determine which link(s) a user chooses on a search results page. However, because the search engine ultimately does not own the servers associated with the chosen site, the search engine cannot track page requests for pages associated with a selected site (after the initial selection from the search results page). Other entities, such as web-analytics companies, may also employ client-side logs to build customer-behavior patterns or the like. While a few examples have been given, client-side logs may be employed by different entities for a variety of purposes.

In sum, traditional logging techniques have left room to improve the logging environment. By merging client-side and server-side logs into a single log as described herein, entities such as website owners are able to determine and track user behavior at a much finer grain of detail than was previously possible. Additionally, by merging client-side interactions into server-side logs, as described herein in some implementations, the logging entity is able to take advantage of the security offered by server-side logs.

For purposes of discussion, techniques for merging client-side and server-side logs are described in the context of a service provider operating a website and a logging service maintaining logs for the service provider. One illustrative implementation of this environment is provided below. However, it should be appreciated that the described merging techniques may be implemented in multiple other environments. For instance, the service provider could implement the functionality of the logging service, or the functionality could be spread amongst the service provider, the logging service, and/or any other combination of entities. For instance, the service provider may maintain the server logs, while another entity may maintain the client logs.

Illustrative System Architecture

FIG. 1 depicts an illustrative architecture 100 in which a user 102 operates a client computing device 104 to access, via a network 106, a website 108 of a service provider 110. Network 106 represents any one or combination of multiple different types of networks, such as cable networks, the Internet, and wireless networks. One or more servers 112(1), ..., 112(N), perhaps arranged in a cluster or as a server farm, include one or more processors and memory executable on the processors to host website 108. Other server architectures may also be used to host the site. With use of processors and memory, website 108 is capable of handling requests from many users (such as user 102) and serving, in response, various web pages that can be rendered at computing devices such as client 104. Web site 108 can be any type of website that supports user interaction, including online retailers, informational sites, social networking sites, blog sites, search engine sites, news and entertainment sites, and/or any other site that may maintain or otherwise desire access to a server-side and/or a client-side log.

In the example of an online retailer, user 102 may navigate to one or more webpages of website 108 while shopping for a particular item or product. To do so, user 102 operates client computing device 104 (also referred to as a "client computer" or simply a "client"). While client 104 is illustrated as a personal computer (PC), this device may be implemented as any number of other types of computing devices, such as a laptop computer, a personal digital assistant (PDA), a mobile phone, a set-top box, a game console, and so forth. As illustrated, client 104 includes one or more processors 114 and memory 116 to store applications and data.

Memory 116 may include volatile and nonvolatile memory, removable and non-removable media implemented in any method or technology for storage of information, such as computer-readable instructions, data structures, program modules, or other data. Such memory includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, RAID storage systems, or any other medium which can be used to store the desired information and which can be accessed by a computing device.

According to some embodiments, a browser application 118 is stored in memory 116 and executes on the processor(s) 114 to provide access to website 108. For example, user 102 may employ browser 118 to access website 108 by submitting a request, such as in the form of a uniform resource locator (URL), to servers 112(1)-(N). Upon receiving the request, servers 112(1)-(N) return a page back to requesting client 104 in the illustrated implementation. Servers 112(1)-(N) may contain static web pages that are pre-generated and stored prior to such requests, or may alternatively store data that is used to populate dynamic web pages that are generated in response to such requests. Browser 118 receives and renders webpages served by website 108 on an associated display. In addition to a user navigating via browser 118, other software applications (browsers or otherwise) could likewise operate to receive and present webpages. Note also that while the above embodiments are described in the context of a web-based system, other types of client/server-based communications and associated application logic could be used.

In the illustrated example, memory 116 is shown to include browser 118, one or more client interactions 120, and one or more page requests 122. Here, user 102 employs browser 118 to receive and render webpages from website 108. While navigating these pages, user 102 may make multiple page requests. For instance, user 102 may conduct a search for a particular item (e.g., "MP3 Players"), may view a search results page associated with the search, and may select to view a page associated with a particular MP3 player. User 102 may then choose (e.g., by selecting hyperlinks) to view pages associated with other MP3 players or may navigate to one or more checkout pages after choosing to purchase a player. Each of these page requests may be stored, temporarily or permanently, in memory 116 before or while being communicated to a server-side log that maintains a history of page requests and other data. In some implementations, page requests 122 and/or the other data are not stored, but rather are communicated over network 106 to some entity, which may maintain a server-side log, as discussed in detail below.

Additionally, certain interactions may occur at client 104 that are transparent to server-side logs. These interactions may comprise user activity, and/or interactions may comprise data that is not directly related to user activity. In the former category for instance, user 102 may employ client 104 to interact with the displayed webpages associated with website 108. For instance, user 102 may scroll down on a page, select a tab on the page, play a video displayed on the page, select an object (e.g., a Java object) on the page, alter a location of a cursor on the page, or may interact with the webpages in any other traditional manner. Additional interactions may include navigating a cursor from one field to another and/or changing focus from a browser in which a page is rendered to another application running on client 104. Still another interaction may include a user selection of a function defined by a scripting language (e.g., Javascript) that is running within a page.

Interactions that are not directly related to user activity, meanwhile, may include rendering requested pages on client 104. Data associated with these interactions may represent whether or not a page was rendered correctly on the client (e.g., by looking at a document object model (DOM) data structure). Additionally or alternatively, this data may represent page-render performance information, such as information indicating how long it took for a page to render on a client. This data may also represent whether or not a requested page rendered on client 104 with errors and, if so, how many. Multiple other types of data may represent other types of client-side activities that are not directly initiated by user activity.

Both types of client-side interactions, which are transparent to server-side logs, may be stored, temporarily or permanently, as interactions 120 on client 104. As discussed in detail below, interactions 120 may then be communicated to a client-side log that maintains a history of these interactions. Similar to page requests 122, client 104 may also communicate interactions 120 to a client-side log without storing them locally. Alternatively, client 104 could itself maintain the client-side log.

To exemplify possible client interactions, imagine that servers 112(1)-(N) render a webpage on an associated display of client 104, and that this rendered page displays a video. Imagine also that this rendered page includes two virtual pages, each associated with a virtual tab. That is, while the webpage itself includes the data associated with both virtual pages, only one of the virtual pages is displayed at a time, depending upon which virtual tab is selected. If user 102 selects the second virtual tab, then the second virtual page is displayed. In this instance, servers 112(1)-(N) have provided all of the data associated with the page, including the data associated with the video and the data associated with the two virtual pages.

Now imagine that user 102 interacts with the rendered page by watching a portion of the video and then selecting the second virtual tab. Because all of this data has already been served to client 104, these interactions do not comprise page requests to servers 112(1)-(N). As such, these interactions are transparent to servers 112(1)-(N). Nevertheless, these interactions may be stored on or otherwise communicated to a client-side log.

FIG. 1 also illustrates a logging service 124 to receive data and maintain data normally maintained in server-side and client-side logs. It is specifically noted that while FIG. 1 illustrates logging service 124 as an entity separate from service provider 110, service provider 110 may implement some or all of the functionality of logging service 124 in other implementations. Additionally, this functionality may be spread amongst still other actors.

In the illustrated example, logging service 124 includes one or more processors 126 and memory 128. Memory 128 includes or otherwise has access to a client-log module 130, a server-log module 132, a format-conversion module 134, and a log-merging module 136. Client-log module 130 receives one or more interactions 138 between users navigating a webpage of website 108 and the webpage itself. For example, these client interactions 138 may include interactions 120 made by user 102. In some embodiments, logging service 124 stores (temporarily or permanently) interactions 138 in a client-side log 140. Client-side log 140 may include some or all client interactions made on webpages associated with website 108, as well as any other data common to client-side logs. In some instances, client-log module 130 does not include client-side log 140, but rather receives interactions 138 for storage in another log (a "merged log" described below).

Server-log module 132, meanwhile, receives one or more page requests 142 as well as other data found in server-side logs. Page requests 142 are generated when users such as user 102 requests a page associated with website 108 from servers 112(1)-(N). Page requests 142 may include page requests 122, made by user 102 operating client 104. Similar to client-log module 130, server-log module 132 may or may not store (temporarily or permanently) page requests 142 in a server-side log 144. Server-side log 144 may include some or all page requests for webpages associated with website 108, as well as any other data common to server-side logs. In instances when server-log module 132 does not maintain a server-side log, server-log module 132 may receive page requests 142 for storage in another log (the "merged log" described below).

Format-conversion module 134, meanwhile, functions to convert a format of one or both of interactions 138 and page requests 142, such that this data has a matching format. For instance, module 134 may convert the format of interactions 138 to match the format of page requests 142. Conversely, module 134 may convert the format of page requests 142 to match the format of interactions 138. In still other instances, format-conversion module 134 may convert the formats of both interactions 138 and page requests 142 to a common format.

Once interactions 138 and page requests 142 (as well as other data found in client-side and server-side logs) have been converted to a common format, log-merging module 136 may merge this data into a merged log 146. In some instances, merged log 146 comprises a single log, which may consist of a single self-contained file or set of files. Because merged log 146 contains both the data that may be found in server-side logs and the data that may be found in client-side logs, merged log 146 contains a comprehensive click stream of user 102 as this user navigated webpages associated with website 108. Additionally, merged log 146 may contain comprehensive click streams of other users as these other users navigated website 108. In some implementations, merged log 146 may include a comprehensive click stream for all or substantially all users that have navigated webpages associated with website 108.

Based on the comprehensive click streams stored on merged log 146, service provider 110 may mine this log to improve the functionality of website 108 and/or may analyze this log to monitor potentially malicious or fraudulent behavior. For instance, FIG. 1 also illustrates that service provider 110 include one or more log clients 148, who may operate one or more computing devices 150(1), ..., (M). Log clients 148 may comprise any employee(s) of the service provider or any other person or entity to which merged log 146 may be helpful. For instance, log clients 148 may comprise a team of employees of service provider 110 that is charged with determining some set of user behavior for the purpose of improving website 108.

Returning to the example above, imagine that user 102 requests, and servers 112(1)-(N) supply and possibly render, a page that contains a video as well as two virtual pages selectable by respective virtual tabs. Imagine also that user 102 watches a portion (e.g., half) of the video before selecting the second of the two virtual tabs in order to display the second of the two virtual pages. Again, this initial page request may be stored in a server-side log, while the interactions would typically be transparent to the server-side log. Instead, these interactions would likely be stored in a client-side log. However, in the illustrated implementation, logging service 124 has merged client-side log 140 with server-side log 144 to form merged log 146.

As such, log clients 148 may analyze merged log 146 to track a comprehensive click stream of users such as user 102. Here, log clients 148 may determine, with reference to merged log 146 that user 102 initially requested the page with the video and the two virtual tabs. This information is likely stored within page requests 142 of merged log 146. Next, log clients 148 may determine, with reference to merged log 146, that user 102 began playing the video on the page, and that the user viewed approximately one-half of the entire video. Log clients 148 may also analyze merged log 146 to determine that user 102 selected the second virtual tab and, hence, viewed the second virtual page. If the user were to scroll down this second page, log clients 148 would also learn this via merged log 146. Therefore, log clients 148 could, for instance, determine whether user 102 actually saw an advertisement on the displayed page that was located near the bottom of the page. With this information, log clients 148 can determine how many users actually viewed the advertisement and, based on this information, may determine to alter a location on the page of the advertisement. Similarly, imagine that merged log 146 shows that a majority of users selected a tab to view a displayed page in "list view" rather than a default "icon view". Given this information, log clients 148 may choose to change the default view to list view rather than icon view in order to increase the number of views of the advertisement. Because log clients can access logs based on client and server based activity, log clients can also determine whether the interaction on a particular displayed page influences user's downstream click activity. For example, a log client could analyze the merged log 146 to determine whether users who watched at least half of the advertisement were likely to view a product category related to the advertisement in the same session. While a few specific examples have been given, log clients 148 may analyze merged log 146 for a multitude of other purposes.

To give another example of the benefits of merged log 146, imagine that log clients 148 determine that the browsers of many users lose focus when these users' cursors are in a particular field of a served webpage. That is, many users either close their browsers or change the focus from the browser to another application when the users come to a certain field of a webpage (e.g., a field that asks users to input their birthdays). Based on the knowledge of this interaction, log clients 148 may deduce that a sizeable percentage users do not feel comfortable divulging the information requested in this field (e.g., users don't feel comfortable giving their birthday). Log clients 148 may accordingly remove this field, if possible, or may choose to take other action based on this knowledge.

In sum, because both client interactions and page requests appear in merged log 146, log clients 148 can learn of users' entire click streams without having to access two unrelated logs, which may be difficult to reconcile to determine user interaction data. With these click streams (which may include user clicks as well as multiple other interactions such as scrolls and the like), log clients 148 can determine exactly how a user consumes webpages associated with website 108 and, hence, can glean important trends that may be useful in improving the site.

Log clients 148 may also analyze merged log 146 to determine the presence of malicious or fraudulent behavior. For instance, if merged log 146 represents that a disproportionate number of client interactions exist for a given page request (or page requests), then log clients 148 may deduce that some or all of the client interactions constitute a fraud. This may be true in scenarios, such as pay-per-click or pay-per-interaction scenarios, where users that are outside of the service provider's framework have the potential to influence a payment that the users receive from service provider 110. For instance, imagine that service provider 110 has agreed to pay a user associated with a video a certain amount of money (or something else of value) each time a user plays the video on a page hosted by website 108. Next, imagine that this user then operations a computing device to make a page request for this page. Then, the user plays the video over and over again. Because both the original page request and the interactions on the page (e.g., the user selecting to play the video) are recorded in merged log 146, log clients 148 may deduce that a fraud has occurred.

Log clients 148 may additionally employ merged log to validate client-side interactions. If these interactions are not validated, then log clients 148 may determine that some or all of the non-validated interactions are fraudulent. For instance, log clients 148 may assume that merged log 146 should contain a page request corresponding to a set of logged client-side interactions. If merged log 146 contains such a page request, then log clients 148 may deem the logged client-side interactions as validated. If, however, the page on which the interactions allegedly occurred has never been requested (i.e., no corresponding page request exists), then log clients 146 may determine or assume that such interactions were fraudulently logged. As such, log clients 146 may disregard these logged interactions.

Log clients 148 may also analyze merged log 146 to reach other conclusions. For instance, imagine that at a certain time, a user made a page request for a particular page, as recorded in merged log 146. Next, merged log 146 represent client interactions on that particular page as well as other pages. Log clients 148 may then deduce that such client interactions are fraudulent, or may deduce that the user is employing multiple tabs on the user's browser to view multiple different pages. Of course, while a few examples have been given, log clients 148 may analyze or employ merged log 146 in multiple other ways.

Illustrative Process for Merging Lots

Figure 2:
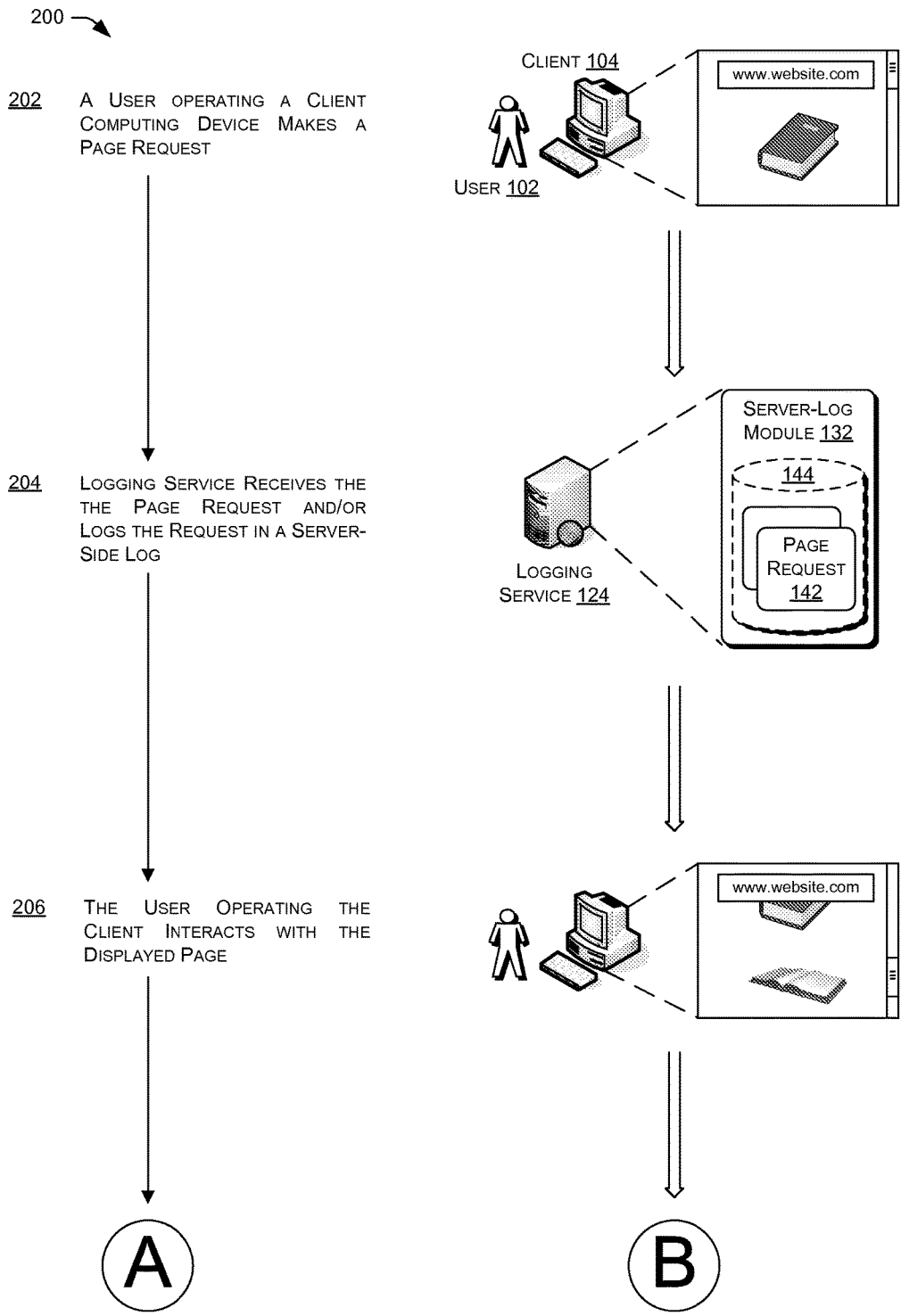
FIGS. 2-3 depict a functional flow diagram of an illustrative process for merging client-side and server-side logs.
Figure 3:
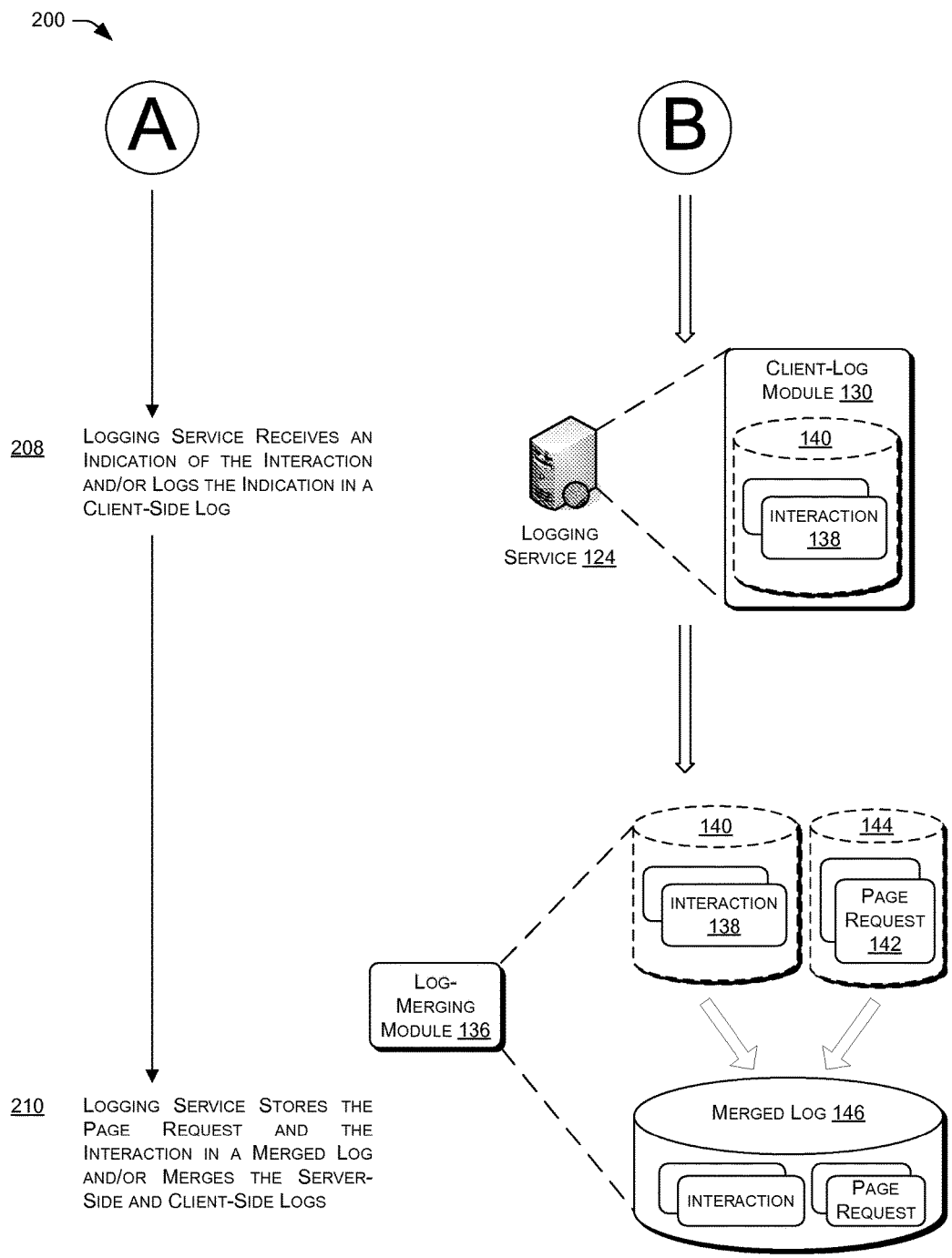

FIGS. 2-3 depict a functional flow diagram of an illustrative process 200 for merging client-side and server-side logs. Process 200 (as well as subsequently-described processes) is illustrated in a logical flow graph, which represents a sequence of operations that can be implemented in hardware, software, or a combination thereof. In the context of software, the operations represent computer-executable instructions that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the process.

Process 200 includes operation 202, which represents user 102 operating client computing device 104 to make a page request for a page associated with website 108. As illustrated, the page associated with the request illustrates a book. Next, operation 204 represents that logging service 124 (and more particularly server-log module 132) receives this page request and may log the request in a server-side log 144. In some instances, however, logging service 124 may not log the page request into a server-side log but may instead directly log the page request into a log such as merged log 146.

Operation 206 then represents user 102 operating client 104 to interact with the displayed page. Here, process 200 illustrates that this client interaction comprises user 102 scrolling down the displayed page. Process 200 continues to FIG. 3, which begins at operation 208 with logging service (and more particularly client-log module 130) receiving the interaction and possibly logging the interaction in a client-side log, such as client-side log 140. Note that this interaction (the user scrolling down the page) is typically transparent to server-side log 144, as the interaction does not comprise any sort of page request directed to the server. Also, again note that logging service 124 may not log the interaction into a client-side log, but may instead directly log the page request into a log such as merged log 146. Finally, operation 210 represents logging service 124 storing the page request and the interaction in a merged log such as merged log 146. Additionally or alternatively, operation 210 may merge client-side log 140 and server-side log 144 into a single log. In instances where the client-side and server-side logs are merged, operation 210 may merge these logs in real-time, near real-time, or in batches.

Operation

Figure 4:
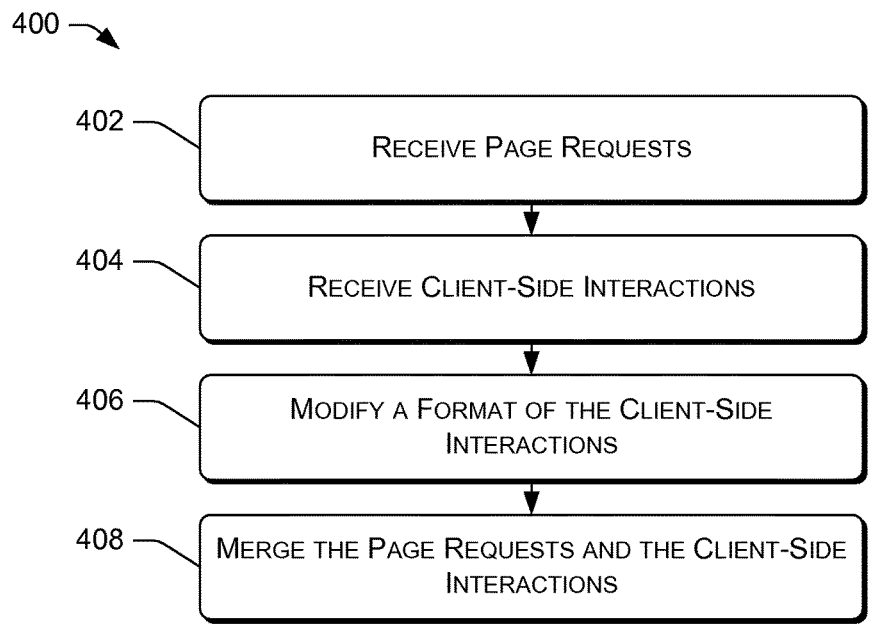
FIGS. 4-6 are flow diagrams of still other illustrative processes for merging client-side and server-side logs.
Figure 5:
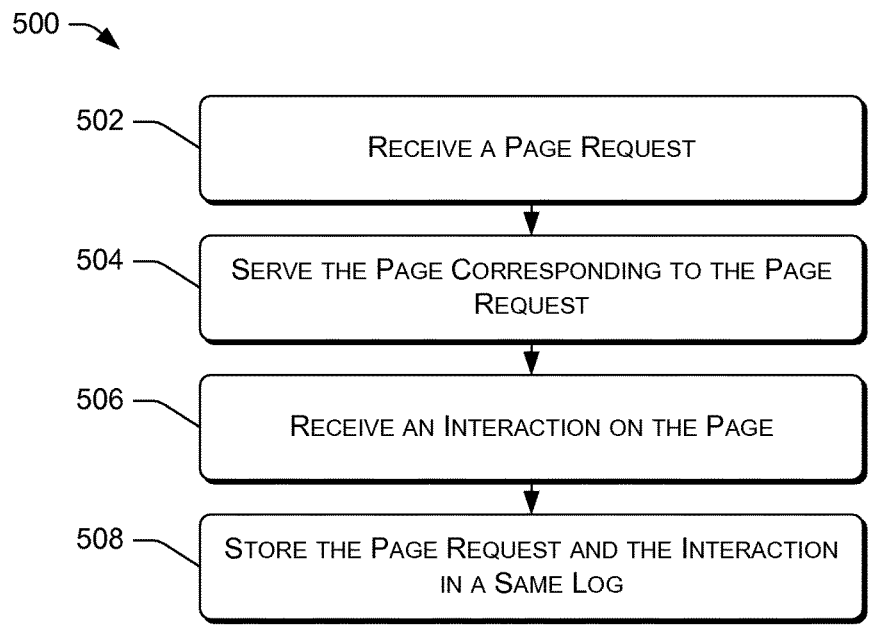
Figure 6:
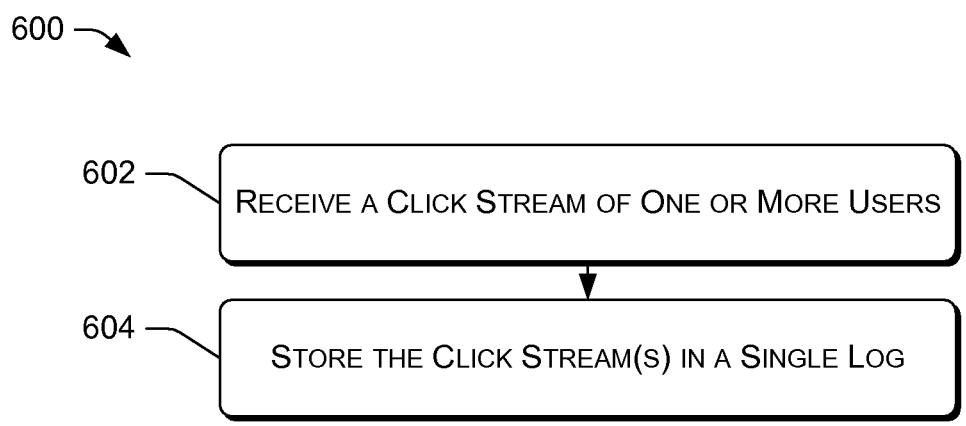

FIGS. 4-6 are flow diagrams of still other illustrative processes for merging client-side and server-side logs. FIG. 4 depicts a process 400, which represents receiving, from a client navigating a site of a service provider, requests for pages associated with the site of a service provider at operation 402. Next, operation 404 represents receiving client-side interactions between the client and a page of the site of the service provider navigated to by the client. These interactions may be any of the interactions discussed above, such as scrolling down on the page, selecting a program object (e.g., a Java object), playing a song or video, and/or the like. Next, operation 406 modifies a format of the client-side interactions to match a log format of the page requests. Finally, operation 408 represents merging the page requests and the client-side interactions into a single log. In some instances, each of the page requests and client-side interactions are associated with a time (e.g., each may be timestamped), which enables the requests and interactions to be merged in a time-ordered sequence.

FIG. 5 illustrates a process 500, which includes an operation 502. This operation represents receiving, from a client computing device and at a server associated with a service provider, a request for a page associated with the service provider. Responsive to the receiving of the request, operation 504 serves the page to the client computing device. Next, operation 506 represents receiving an interaction on the served page made by the client computing device. In some instances, this interaction does not comprise a request to the server associated with the service provider, and thus may be transparent to the server. Finally, operation 508 stores the received page request and the received interaction in a same log.

Finally, FIG. 6 illustrates a process 600. Operation 602 represents receiving a click stream of one or more users as these users navigate one or more pages associated with a service provider. Operation 604, meanwhile, represents storing these one or more click streams in a single log, such as merged log 146. These click streams may each include at least one page request, as well as at least one client interaction made on the served page. Again, these interactions may comprise any of the interactions described above.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. A method comprising:
   receiving page requests made by a user of a client computing device, the page requests corresponding to webpages of a website associated with an online entity;
   storing the received page requests in a server-side log;
   receiving website-navigation interactions made by the user of the client computing device on the webpages of the website requested in the page requests, the website-navigation interactions made by the user on the webpages of the website being transparent to the server-side log;
   modifying a first format of the received web site-navigation interactions made by the user of the client computing device on the webpages of the website to match a second format of the received page requests stored in the server-side log;
   storing the received web site-navigation interactions made by the user on the webpages of the website in a client-side log;
   merging together the server-side log and the client-side log to form a merged log containing the received page requests and the received website-navigation interactions made by the user on the webpages of the website in a common format;
   determining, based at least in part on analyzing the merged log, a click stream of the user of the client computing device as the user navigated the webpages of the website associated with the online entity;
   analyzing the click stream to determine a number of the received web site-navigation interactions made by the user on the webpages of the website per webpage; and
   determining, based at least in part on the number, whether one or more of the received web site-navigation interactions made by the user on the webpages of the website have characteristics of fraudulent activity.

2. A server system comprising:
   one or more processors;
   memory, accessible by the one or more processors;
   a client-log module stored in the memory and executable on the one or more processors to receive a history of website-navigation interactions of a client with one or more pages of a website associated with a service provider, the website-navigation interactions of the client with the one or more pages being transparent to a server of the service provider;
   a server-log module stored in the memory and executable on the one or more processors to receive a history of page requests for the one or more pages of the web site associated with the service provider;
   a log-merging module to:
     receive the history of the website-navigation interactions of the client with the one or more pages of the website and the history of the page requests;
     merge the history of the website-navigation interactions of the client with the one or more pages of the website and the history of the page requests into a single log that represents a click stream of the client on the one or more pages of the web site;
     analyzing the click stream to determine a number of the website-navigation interactions of the client with the one or more pages of the website per page; and
     determine, based at least in part on the number, whether one or more of the website-navigation interactions of the client with the one or more pages of the web site have characteristics of fraudulent activity; and
   a format-conversion module stored in the memory and executable on the one or more processors to convert a format of either or both of the received web site-navigation interactions of the client with the one or more pages of the web site and the received page requests such that a first format of the received web site-navigation interactions of the client with the one or more pages of the web site matches a second format of the received page requests.

3. A server system as recited in claim 2, wherein the click stream shows substantially all of the page requests and the website-navigation interactions made by the client on the one or more pages of the website associated with the service provider.

4. A server system as recited in claim 2, wherein the single log comprises a single, self-contained file.

5. A server system as recited in claim 2, wherein the format-conversion module converts the first format of the received web site-navigation interactions of the client with the one or more pages of the website to match the second format of the received page requests.

6. One or more non-transitory computer-readable media comprising computer-executable instructions that, when executed on one or more processors, perform acts comprising:
   receiving, from a client navigating a site of a service provider, requests for pages associated with the site of the service provider;
   storing records associated with the page requests in a server-side log;
   receiving client-side, site-navigation interactions that occur at the client and are associated with the pages of the site of the service provider, the client-side, site-navigation interactions being transparent to the server-side log;

merging the records associated with the page requests and records associated with the client-side, site-navigation interactions into a common log;

modifying a format of either or both of the records of the client-side, site-navigation interactions and the records of the page requests such that a first format of the records of the client-side, site-navigation interactions matches a second format of the records of the page requests;

creating, from the common log, a time-ordered click stream of the client-side, site-navigation interactions as the client navigated the site of the service provider;

analyzing the time-ordered click stream to determine a number of the client-side, site-navigation interactions per page; and determine whether one or more of the records of the client-side, site navigation interactions have characteristics of fraudulent activity.

7. One or more non-transitory computer-readable media as recited in claim 6, wherein the client-side, site-navigation interactions are associated with rendering a requested page on the client.

8. One or more non-transitory computer-readable media as recited in claim 6, wherein the modifying comprises modifying the first format of the records of the client-side, site-navigation interactions to match the second format of the records of the page requests.

9. A method comprising:

receiving, from a client computing device and at a server associated with a service provider, a request for a page associated with the service provider;

responsive to the receiving of the request, serving the page to the client computing device and storing the received page request in a server-side log;

receiving navigation interactions on the served page made by the client computing device, wherein the navigation interactions on the served page made by the client computing device are transparent to the server-side log, and wherein the received navigation interactions are free from a request to the server associated with the service provider;

modifying a format of either or both of the received page request and the received navigation interactions such that a first format of the received navigation interactions matches a second format of the received page request;

storing a record of the received page request and a record of the received navigation interactions in a common location;

arranging the record of the received page request and the record of the received navigation interactions in a time-ordered sequence;

analyzing the time-ordered sequence to determine a number of the navigation interactions on the served page made by the client computing device; and determining, based at least in part on the number, whether the record of the received navigation interactions have characteristics of fraudulent activity.

10. A method as recited in claim 9, wherein the common location comprises a log file or a database.

11. A method as recited in claim 9, wherein at least one of the navigation interactions, transparent to the server-side log, on the served page comprises selecting a tab, scrolling, playing a video, interacting with a program object, or altering a location of a cursor.

12. A method as recited in claim 9, wherein the navigation interactions on the served page are transparent to the server associated with the service provider.

13. A method as recited in claim 9, further comprising:

storing a record of the received page request in a server-side log; and storing a record of the received navigation interaction in a client-side log; and wherein the storing of the record of the received page request and the record of the received navigation interaction in the same log comprises merging together the server-side log and the client-side log.

14. One or more non-transitory computer-readable media storing computer-executable instructions that, when executed on one or more processors, perform acts comprising:

receiving page requests made by a user of a client computing device, the page requests corresponding to webpages of a website associated with an online entity;

storing the received page requests in a server-side log;

receiving website-navigation interactions made by the user of the client computing device on the webpages of the website requested in the page requests, the website-navigation interactions made by the user on the webpages of the website being transparent to the server-side log;

modifying a first format of the received website-navigation interactions made by the user of the client computing device on the webpages of the website to match a second format of the received page requests stored in the server-side log;

storing the received website-navigation interactions made by the user on the webpages of the website in a client-side log;

merging together the server-side log and the client-side log to form a merged log containing the received page requests and the received website-navigation interactions made by the user on the webpages of the website in a common format;

determining, based at least in part on analyzing the merged log, a click stream of the user of the client computing device as the user navigated the webpages of the website associated with the online entity;

analyzing the click stream to determine a number of the received website-navigation interactions made by the user on the webpages of the website per webpage; and determining, based at least in part on the number, whether one or more of the received website-navigation interactions made by the user on the webpages of the website have characteristics of fraudulent activity.

15. One or more non-transitory computer-readable media as recited in claim 14, wherein the webpages of the website associated with the online entity include a webpage running a scripting language, and wherein at least one of the website-navigation interactions comprises a user execution of a function defined by the scripting language that is transparent to the server-side log.

16. One or more non-transitory computer-readable media as recited in claim 14, wherein the click stream shows substantially all of the page requests and the website-navigation interactions made by the user of the client computing device on the webpages of the website.

17. A method as recited in claim 1, wherein the webpages of the website associated with the online entity include a webpage running a scripting language, and wherein at least one of the website-navigation interactions comprises a user execution of a function defined by the scripting language that is transparent to the server-side log.

18. A method as recited in claim 1, wherein the click stream shows substantially all of the page requests and the website-navigation interactions made by the user of the client computing device on the webpages of the website.

* * * * *